United States Patent
Lealman et al.

(10) Patent No.: US 7,627,216 B2
(45) Date of Patent: Dec. 1, 2009

(54) FOLDED CAVITY OF OPTOELECTRONIC DEVICES

(75) Inventors: Ian Francis Lealman, Ipswich (GB); Graeme Douglas Maxwell, Ipswich (GB); David William Smith, Woodbridge (GB); Michael James Robertson, Ipswich (GB); Alistair James Poustie, Ipswich (GB); Xin Chen, Ipswich (GB)

(73) Assignee: The Centre for Integrated Photonics Limited, Ipswich (GB)

( * ) Notice: Subject to any disclaimer, the term of this patent is extended or adjusted under 35 U.S.C. 154(b) by 0 days.

(21) Appl. No.: 11/917,700

(22) PCT Filed: Jun. 19, 2006

(86) PCT No.: PCT/GB2006/002253

§ 371 (c)(1), (2), (4) Date: Jun. 30, 2008

(87) PCT Pub. No.: WO2006/134394

PCT Pub. Date: Dec. 21, 2006

(65) Prior Publication Data

US 2009/0129737 A1 May 21, 2009

(30) Foreign Application Priority Data

Jun. 17, 2005 (GB) .................. 0512386.4

(51) Int. Cl.
G02B 6/26 (2006.01)
G02B 6/42 (2006.01)

(52) U.S. Cl. .................. 385/50; 385/32; 385/47; 216/24; 65/429; 438/31

(58) Field of Classification Search .................. 385/24, 385/27, 31, 32, 39, 45, 47, 50, 129, 132, 385/146; 438/29, 31, 33, 42, 43; 216/24; 65/386, 429, 472

See application file for complete search history.

(56) References Cited

U.S. PATENT DOCUMENTS

| 5,088,105 | A | | 2/1992 | Scifres et al. |
| 5,097,479 | A | | 3/1992 | Opower et al. |
| 5,825,951 | A | * | 10/1998 | Kitamura ..................... 385/45 |
| 5,852,696 | A | | 12/1998 | Collins et al. |
| 6,243,516 | B1 | * | 6/2001 | Seino ......................... 385/47 |
| 6,480,647 | B1 | | 11/2002 | Kitamura |

(Continued)

OTHER PUBLICATIONS

G. Maxwell et al.; "Hybrid Integration of Monolithic Semiconductor Optical Amplifier Arrays using Passive Assembly"; May 31, 2005.

(Continued)

*Primary Examiner*—Daniel Petkovsek
(74) *Attorney, Agent, or Firm*—Renner, Otto, Boisselle & Sklar, LLP

(57) ABSTRACT

An optoelectronic device has at least a first facet (S), a first waveguide (2) and a second waveguide (3). The waveguides are substantially coincident at the first facet (6), such that light travelling along the first waveguide (2) is reflected into the second waveguide (3) by the first facet (6). The first facet (6) is formed by precision cleaving. Preferably an etch feature is incorporated in the same mask level as that to define the waveguide core.

5 Claims, 2 Drawing Sheets

U.S. PATENT DOCUMENTS 6,718,076 B2 * 4/2004 Bures et al. .................... 385/7
6,760,510 B2 * 7/2004 Kimura ....................... 385/24
6,778,718 B2    8/2004 Maxwell
6,950,582 B2 * 9/2005 Lee et al. ..................... 385/49
2004/0113164 A1    6/2004 Corbet et al.

OTHER PUBLICATIONS

Friedrich et al., Journal of Lightwave Technology, vol. 10, 3, 1992, pp. 336-339.

* cited by examiner

FOLDED CAVITY OF OPTOELECTRONIC DEVICES

This application is a national phase of International Application No. PCT/GB2006/002253 filed Jun. 19, 2006 and published in the English language.

FIELD OF THE INVENTION

This invention relates to optoelectronic devices and, in particular to a discrete optoelectronic device that uses a folded cavity to enhance the performance of a semiconductor optical amplifier. The invention may find application in fields including communications systems, computer networks, computer equipment, instrumentation, sensors and sensor networks, for example.

BACKGROUND TO THE INVENTION

The use of etched features to enable the cleaving of III-V semiconductor devices such as indium phosphide (InP) substrate telecommunications lasers is well known and described in Friedrich et-al, Journal of Lightwave Technology, Vol 10, 3, 1992, pp 336-339. In addition, the combination of precision cleaving with mode expansion has been shown to offer a route to low cost optoelectronics packaging as disclosed by Collins in U.S. Pat. No. 5,852,696, and to enable the passive alignment of hybrid optoelectronic devices as disclosed by Maxwell in U.S. Pat. No. 6,778,718.

SUMMARY OF THE INVENTION

Viewed from one aspect, this invention provides an optoelectronic device having at least a first facet, the device comprising a first waveguide and a second waveguide, wherein the waveguides are substantially coincident at the first facet, such that light travelling along the first waveguide is reflected into the second waveguide by the first facet.

In general, at the point where the waveguides meet the first facet, the angle between the first waveguide and the normal to the first facet is substantially equal to the angle between the second waveguide and the normal to the first facet. Such a configuration ensures effective reflection at the first facet.

The device may comprise a second facet and at least one of the waveguides may be curved such that the waveguides are substantially parallel as they meet the second facet. The first facet and the second facet may be substantially parallel.

The first facet may be coated with at least one of a wavelength selective filter, a polarisation-modifying film or a polarisation selective film.

The invention also extends to a method of fabricating an optoelectronic device as described, the method comprising:
  defining an etch feature in a waveguide layer that forms the first and second waveguides;
  etching the feature to form a point of weakness in the layer; and
  applying pressure to the waveguide layer and any additional layers of the device to cleave the waveguide layer, whereby to form the first facet.

Accordingly, this invention, at least in its preferred embodiments, provides a semiconductor optoelectronic device such as a semiconductor optical amplifier (SOA) formed by using single-ended optical coupling and using two waveguides which meet at an angle and reflect at the rear facet. The reflection facet is precision cleaved by defining an etch feature in the same waveguide layer and mask level as the waveguide used to guide light at the reflecting facet. This feature is then etched to form a V or other such shape that will act as a weak spot over which a cleave may be initiated by utilising the known approach of applying force to the other side of the wafer below the cleave initiator. The incorporation of such a feature in the same mask level as that used to define the waveguide core allows the position of the cleave with respect to the facet to be defined to a sub-micron tolerance. Once cleaved the folded waveguide end of the device may be coated with a wavelength or polarisation selective coating to affect the overall optical performance of the device. The benefits of this design include being able to effect a low loss optical modification of the device properties and having single ended optical packaging for lower cost/lower time of flight design for bit-serial optical processing.

To date the inventors are not aware of anybody utilising precision cleaving to form a waveguide device with a cavity that is folded back using an angled waveguide to realise a device which can offer single-sided alignment for hybrid integration. Neither are they aware of using such a device with novel, wavelength sensitive thin film coatings to produce a device with unusual optical properties.

Viewed from a broad aspect, the invention provides an optoelectronic device employing a folded cavity design to allow a proportion of the light to be coupled from a first waveguide into a second waveguide. The position of the rear facet may be determined using a self-aligned etched feature to ensure good optical coupling between the first and second waveguides. The rear facet of the device may be coated with a wavelength selective filter to modify the feedback into the second guide. The rear facet of the device may be coated with a film that either modifies the polarisation state of the propagating wave or preferentially selects a particular polarisation state of the propagating wave. The device may be a semiconductor optical amplifier. The electrical contacts on the waveguides may be split to enable separate biasing of the two waveguides. The second guide may be curved along its length to ensure that the light emitted from the two waveguides are essentially parallel.

BRIEF DESCRIPTION OF THE DRAWINGS

An embodiment of the invention will now be described by way of example only and with reference to the accompanying drawings, in which.

DETAILED DESCRIPTION OF EMBODIMENTS

Figure 1:
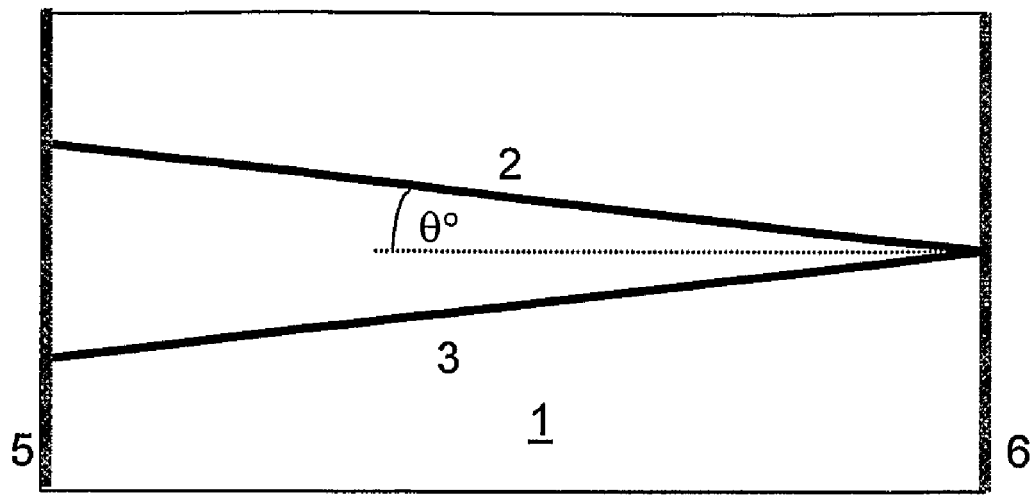
FIG. 1 is a schematic representation of a semiconductor optoelectronic device according to a first embodiment of the invention with straight guides that are angled to the facet by the same amount.

In an embodiment of the invention, a semiconductor optical amplifier (SOA) 1 comprises a pair of waveguides 2 and 3 that meet the front facet 5 of the device at an angle to reduce residual reflection, where the angle of reflection θ (between the normal to the facet and the waveguide) should be between 7 and 10 degrees. In the first embodiment shown in FIG. 1 the guides 2, 3 are straight and light is emitted in a non-parallel manner from the two guides. The front facet of the device 5 may be left as cleaved or coated with a standard anti-reflection (AR) coating to reduce facet reflectivity. The folded cavity facet 6 may be left as cleaved or coated with either a wavelength selective coating or other such coating used to modify the device properties, the latter may include films that are polarisation selective or polarisation altering. This embodiment is particularly suited to the hybrid integration of active and passive optical devices where the active optoelectronics is realised using a folded cavity device and various passive optical devices are formed on a silica on silicon optical circuit board. This embodiment is suited to hybrid integration.

Figure 2:
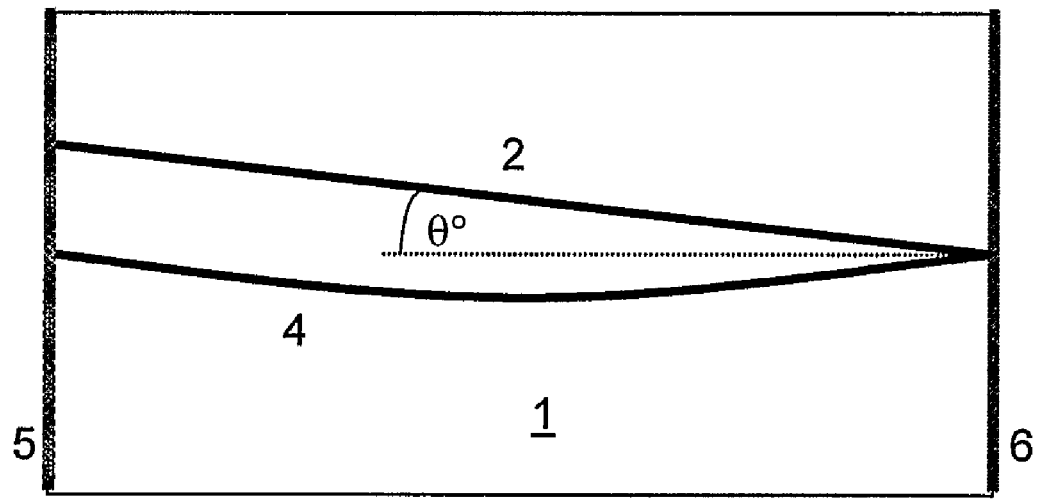
FIG. 2 is a schematic representation of a semiconductor optoelectronic device according to a second embodiment of the invention where one guide is curved to allow the outputs from the front facet to be parallel.

In the second embodiment shown in FIG. 2, one of the waveguides 4 is curved through an angle that is twice that of the angle at which the guides meet the front facet to enable the emission from both waveguides to be parallel. This second embodiment offers simplified fibre alignment and packaging for a discreet device. In both of these preferred embodiments, the waveguide at the reflecting facet 6 may be the same as that used to generate light or may be a passive waveguide that may or may not use mode expansion to increase alignment tolerance and reduce residual facet reflectivity.

Figure 3:
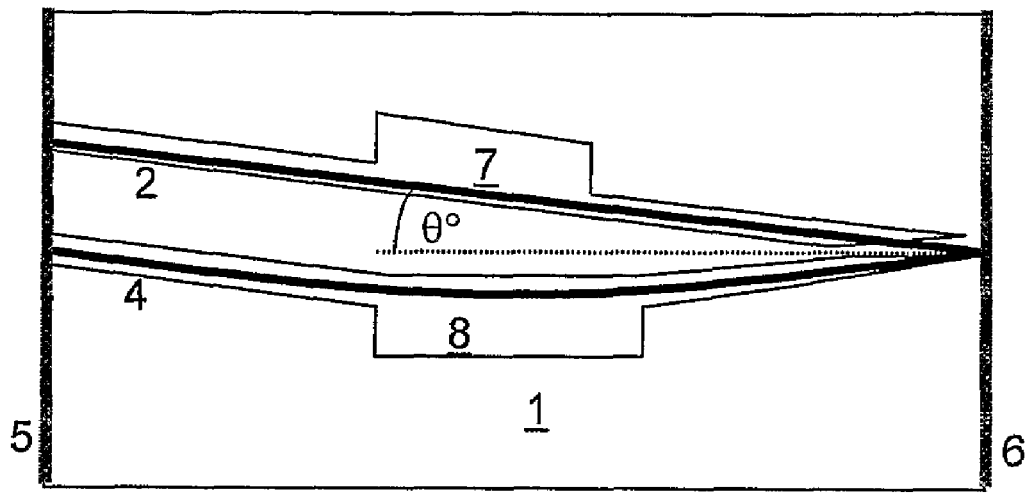
FIG. 3 is a schematic representation of a semiconductor optoelectronic device according to an alternative version of the first embodiment of the invention where the device is shown to have two distinct contacts on the upper metal layer.
Figure 4:
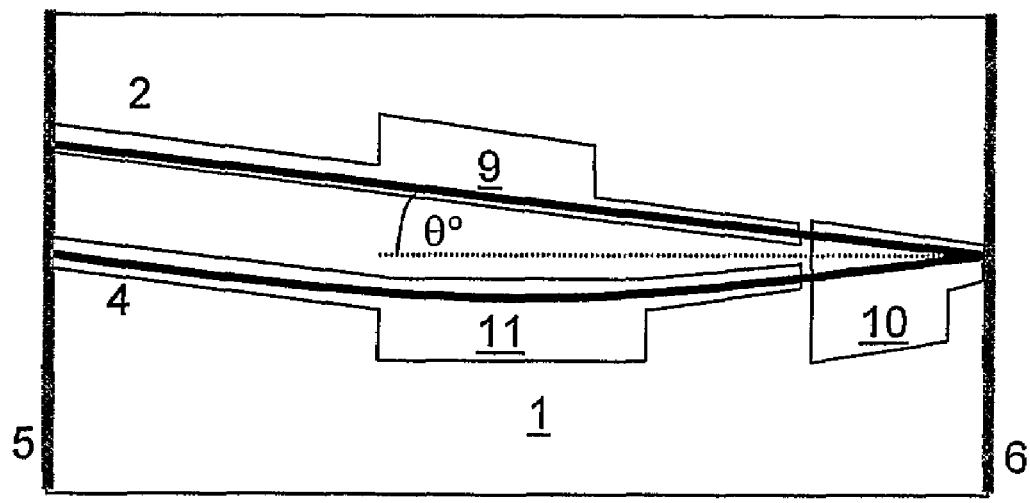
FIG. 4 is a schematic representation of a semiconductor optoelectronic device according to a further alternative version of the first embodiment of the invention where the device is shown to have three distinct contacts on the upper metal layer.

A further series of embodiments is also possible where the metal contacts on the top surface of the device are segmented to allow the differential pumping of the waveguide to allow for increased device functionality. FIG. 3 shows such a device where the metal contacts are segmented into two sections 7 and 8. FIG. 4 shows a device where the metal contacts are divided into three sections 9, 10 and 11.

In summary, an optoelectronic device has at least a first facet 6 and a first waveguide 1 and a second waveguide 2. The waveguides are substantially coincident at the first facet 6, such that light travelling along the first waveguide 1 is reflected into the second waveguide 2 by the first facet 6.

The invention claimed is:

1. A method of fabricating an optoelectronic device comprising a first waveguide and a second waveguide, that are substantially coincident at a first facet, such that light travelling along the first waveguide is reflected into the second waveguide by the first facet, characterised in that the method comprises:

defining an etch feature in a waveguide layer that forms the first and second waveguides;

etching the feature to form a point of weakness in the layer; and applying pressure to the waveguide layer and any additional layers of the device to cleave the waveguide layer, whereby to form the first facet.

2. A method of fabricating an optoelectronic device as claimed in claim 1, wherein at the point where the waveguides meet the first facet, the angle (θ) between the first waveguide and the normal to the first facet is substantially equal to the angle between the second waveguide and the normal to the first facet.

3. A method of fabricating an optoelectronic device as claimed in claim 1, wherein the device comprises a second facet and at least one of the waveguides is curved such that the waveguides are substantially parallel as they meet the second facet.

4. A method of fabricating an optoelectronic device as claimed in claim 3, wherein the first facet and the second facet are substantially parallel.

5. A method of fabricating an optoelectronic device as claimed in claim 1, wherein the first facet is coated with at least one of a wavelength selective filter, a polarisation-modifying film or a polarisation selective film.

* * * * *